United States Patent [19]

Ohta et al.

[11] 4,347,482

[45] Aug. 31, 1982

[54] AMPLIFIER EQUIPPED WITH CIRCUIT FOR PREVENTING ELECTROSTATIC BREAKDOWN

[75] Inventors: Shigeo Ohta; Takeo Suzuki, both of Soma; Kazumic Kuwabara, Namie-Machi, all of Japan

[73] Assignee: Alps Electric Co., Ltd., Tokyo, Japan

[21] Appl. No.: 142,218

[22] Filed: Apr. 21, 1980

[30] Foreign Application Priority Data

May 2, 1979 [JP] Japan .................. 54-59382[U]

[51] Int. Cl.³ ........................................ H03F 3/04
[52] U.S. Cl. .................................. 330/298; 361/100
[58] Field of Search ............... 330/51, 296, 253, 298, 330/306; 307/318, 549, 551, 566; 361/91, 100

[56] References Cited

U.S. PATENT DOCUMENTS 3,128,392 4/1964 Jones .................................. 307/566
3,657,662 4/1972 Lemouzy ........................... 330/253
3,706,936 12/1972 Krohn ................................. 330/306
4,023,106 5/1977 Utsunomiya ....................... 325/462
4,115,737 9/1978 Hongu et al. ...................... 325/459

*Primary Examiner*—James B. Mullins
*Assistant Examiner*—Gene Wan
*Attorney, Agent, or Firm*—Guy W. Shoup; Gerard F. Dunne

[57] ABSTRACT

A circuit for preventing electrostatic breakdown consists of a resistor which is connected between ground and an input terminal of an amplifier including a transistor. A d-c voltage source applies a constant voltage to the resistor at all times, and a series circuit consisting of a diode and a Zener diode connected cathode to cathode. The anode of the Zener diode is grounded in parallel with the above-mentioned resistor, and the Zener voltage of the Zener diode is set so as to be greater than the voltage across the resistor.

5 Claims, 1 Drawing Figure

AMPLIFIER EQUIPPED WITH CIRCUIT FOR PREVENTING ELECTROSTATIC BREAKDOWN

BACKGROUND OF THE INVENTION

The present invention relates to a circuit for preventing electrostatic breakdown, which circuit is effective for protecting transistors in an amplifier, circuit.

Transistors for amplifying signals over a wide band or transistors for uniformly amplifying VHF signals and UHF signals, are usually very weak against high voltages due to their construction. If a high voltage generated by static electricity is applied to an input terminal of an amplifier, therefore, an overcurrent flows into the transistors and causes them to breakdown instantaneously.

SUMMARY OF THE INVENTION

The object of the present invention is to provide an amplifier equipped with a circuit for preventing such electrostatic breakdown.

Another object of the present invention is to provide an amplifier equipped with a circuit for preventing electrostatic breakdown, which circuit does not substantially increase parasitic capacities.

A further object of the present invention is to provide a circuit for preventing electrostatic breakdown, which circuit is simply and inexpensively constructed and capable of being easily appended to existing circuits.

The circuit for preventing electrostatic breakdown according to the present invention consists of a resistor which is connected between ground and an input terminal of an amplifier including a transistor. A d-c voltage source applies a constant voltage to the resistor at all times, and a series circuit consisting of a diode and a Zener diode connected cathode to cathode is connected in parallel with the resistor. The anode of the Zener diode is grounded in parallel with the resistor, and the Zener voltage of the Zener diode is set so as to be greater than the voltage across the resistor.

DESCRIPTION OF THE PREFERRED EMBODIMENT

Figure 1:
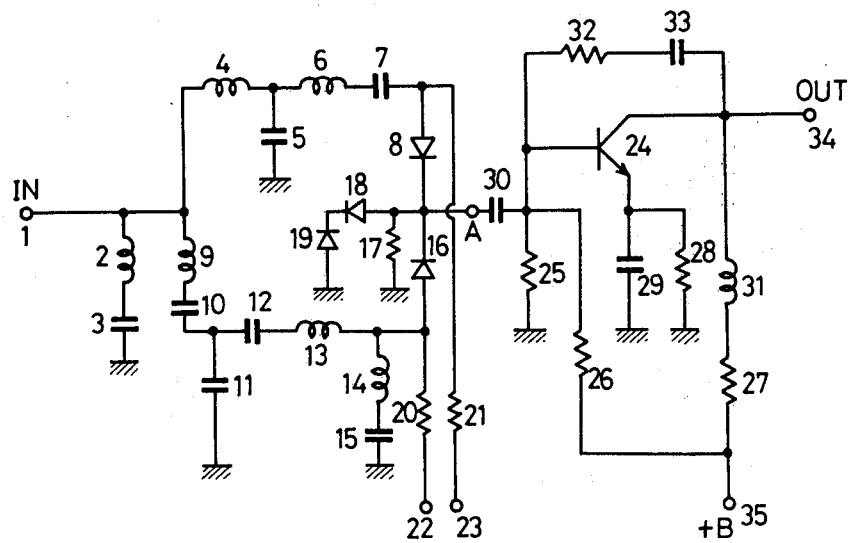
FIG. 1 is a diagram of a high-frequency amplifier circuit of a television tuner to which is applied the circuit for preventing electrostatic breakdown of the present invention.

FIG. 1 is a circuit diagram illustrating the state in which the circuit for preventing electrostatic breakdown of the present invention is applied to a high-frequency amplifier circuit of a television turer. Referring to FIG. 1, the circuit for preventing the electrostatic breakdown consists of a resistor 17 which is connected between an input terminal A of the amplifier and ground, and a series circuit, consisting of two diodes 18 and 19, which is connected in parallel with the resistor 17. Here, the diode 18 is an ordinary one and the diode 19 is a Zener diode. The resistor 17 is constantly served with a d-c voltage through a terminal 22 or a terminal 23; i.e., a constant voltage is developed across the terminals of the resistor. The Zener voltage of the Zener diode 19 has been set to be greater than the voltage applied to the resistor 17.

The circuit of the invention is described below in further detail in conjunction with FIG. 1. VHF and UHF signals are introduced from a terminal 1. When the VHF signals are desired to be received, a positive voltage is supplied to the terminal 23 so that a switching diode 8 is rendered conductive. The VHF signals are fed through a filter consisting of coils 4 and 6 and capacitors 5 and 7 to the base of a transistor 24 by coupling capacitor 30 for high-frequency amplification. The VHF signals are then sent from an output terminal 34 to a subsequent stage. The positive voltage which biases the switching diode 8 in the forward direction is also applied to the resistor 17, whereby a switching diode 16 is biased in the reverse direction and is rendered nonconductive, so that the UHF signals passing through a low filter network are not transmitted to the transistor 24.

Then, when the UHF signals are desired to be received, a positive voltage is supplied to the terminal 22 to render the switching diode 16 conductive. The positive voltage is also applied to the resistor 17 to render the switching diode 8 non-conductive. The UHF signals are fed to the base of the transistor 24 passing through a filter consisting of coils 9, 13, 14 and capacitors 10, 11, 12, 15. The UHF signals are then sent from the output terminal 34 to the subsequent stage.

The collector of the transistor 24 is served with a biasing voltage from a terminal 35 via a choke coil 31 and a resistor 27, the base is biased through resistors 25 and 26, and the emitter is connected to an emitter resistor 28 and a by-pass capacitor 29.

A negative feedback circuit consisting of a resistor 32 and a capacitor 33 is connected between the collector and the base of the transistor 24 so that it will operate over a wide band.

A series circuit consisting of the Zener diode 19 and the diode 18 is connected in parallel with the resistor 17 which is connected between ground and a connection point connecting the switching diodes 8 and 16 and which permit a biasing current to flow to the switching diodes 8, 16 at all times. The cathode of the Zener diode 19 and cathode of the diode 18 have been connected to each other. The Zener voltage of the Zener diode 19 is set to be higher than the voltage which is constantly applied to the resistor 17, and the diode 18 has a small capacitance.

According to the thus constructed circuit of the present invention, when a high voltage generated by static electricity is impressed upon the terminal 1, the diode 18 is rendered conductive so that an electric current flows into the Zener diode 19. Therefore, no overcurrent flows into the transistor 24; i.e., the transistor 24 is protected. The generation of parasitic capacitance by the provision of the circuit for preventing electrostatic breakdown in an undesirable phenomenon. In particular, the development of parasitic capacitance becomes a problem in the UHF band. According to the circuit of the present invention in which the Zener diode 19 and the diode 18 are connected in series, however, the diode 18 has such a small capacitance that the capacitance as a whole is small even though the capacitance of the Zener diode 19 may be large. Consequently, the input circuit is not adversely affected. Furthermore, since the voltage for operating the circuit for preventing electrostatic breakdown is adjusted by the Zener voltage of the Zener diode 19 and by the resistance of the resistor 17, the transistor can be completely protected.

What is claimed is:

1. An amplifier equipped with a circuit for preventing electrostatic breakdown, comprising:

a resistor connected between an input terminal of the amplifier and ground;

means for applying a constant d-c voltage to said resistor; and a series circuit consisting of a diode and a Zener diode, the cathodes of each of which being connected to each other, the anode of said Zener diode being grounded in parallel with said resistor, and the Zener voltage of said Zener diode being set to be greater than the voltage across the terminals of said resistor.

2. An amplifier equipped with a circuit for preventing electrostatic breakdown according to claim 1 wherein filters for passing VHF signals and UHF signals are connected to said input terminal of said amplifier, said filters being connected in parallel with each other.

3. An amplifier equipped with a circuit for preventing electrostatic breakdown according to claim 2 wherein the output terminals of said filter for passing VHF signals and the output terminals of said filter for passing UHF signals are connected to said input terminal of said amplifier via switching diodes, respectively.

4. An amplifier equipped with a circuit for preventing electrostatic breakdown according to claim 3 wherein a d-c power source is connected to the anode of each of said switching diodes to render them conductive.

5. An amplifier equipped with a circuit for preventing electrostatic breakdown according to claim 4 wherein said d-c power source for driving said switching diodes is said power source which applies a constant voltage to said resistor which is connected between said input terminal of said amplifier and ground.

* * * * *